(12) United States Patent
Sattler et al.

(10) Patent No.: US 12,324,091 B2
(45) Date of Patent: Jun. 3, 2025

(54) COMPONENT CARRIER FOR MICROWAVE APPLICATIONS WITH STACK PIECES INTERCONNECTED AT AN ELECTRICALLY CONDUCTIVE CONNECTION INTERFACE

(71) Applicant: AT&S Austria Technologie & Systemtechnik Aktiengesellschaft, Leoben (AT)

(72) Inventors: Sebastian Sattler, Graz (AT); Simon Pressler, Graz (AT); Heinrich Trischler, Trofaiach (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 354 days.

(21) Appl. No.: 18/049,604

(22) Filed: Oct. 25, 2022

(65) Prior Publication Data
US 2023/0134610 A1 May 4, 2023

(30) Foreign Application Priority Data
Oct. 28, 2021 (EP) .................................... 21205396

(51) Int. Cl.
*H05K 1/02* (2006.01)
(52) U.S. Cl.
CPC ........... *H05K 1/0245* (2013.01); *H05K 1/024* (2013.01); *H05K 1/0242* (2013.01); *H05K 1/0243* (2013.01); *H05K 2201/10098* (2013.01)
(58) Field of Classification Search
CPC .... H05K 1/0245; H05K 1/024; H05K 1/0242; H05K 1/0243; H05K 2201/10098
See application file for complete search history.

(56) References Cited

U.S. PATENT DOCUMENTS

| | | |
|---|---|---|
| 5,381,596 A | 1/1995 | Ferro |
| 2004/0150487 A1 | 8/2004 | Tabatabai |
| 2006/0139117 A1* | 6/2006 | Brunker ................. H05K 1/024 333/1 |
| 2007/0154155 A1 | 7/2007 | Brist et al. |
| 2020/0128702 A1* | 4/2020 | Cheng .................. H05K 3/4697 |
| 2020/0235453 A1 | 7/2020 | Lang |
| 2022/0151072 A1* | 5/2022 | Kono ..................... H01L 23/467 |
| 2023/0029270 A1* | 1/2023 | Lee ...................... H05K 3/4644 |

FOREIGN PATENT DOCUMENTS

EP 3691421 A1 8/2020

OTHER PUBLICATIONS

Tomezak, A.; Extended European Search Report in EP Patent Application No. 21205396.1; pp. 1-8; Apr. 19, 2022; European Patent Office; 80298, Munich, Germany.

* cited by examiner

*Primary Examiner* — Hoa C Nguyen
(74) *Attorney, Agent, or Firm* — Robert A. Blaha; Smith Tempel Blaha LLC (57) ABSTRACT

A component carrier includes a stack with at least one electrically conductive layer structure and at least one electrically insulating layer structure, and a microwave structure embedded at least partially in the stack. The microwave structure configured for exciting a microwave propagation mode and having at least two stack pieces being interconnected with each other at an electrically conductive connection interface.

15 Claims, 6 Drawing Sheets

COMPONENT CARRIER FOR MICROWAVE APPLICATIONS WITH STACK PIECES INTERCONNECTED AT AN ELECTRICALLY CONDUCTIVE CONNECTION INTERFACE

CROSS-REFERENCE TO RELATED APPLICATIONS

This application claims the benefit of the filing date of European Patent Application No. 21205396.1, filed on Oct. 28, 2021, the disclosure of which is hereby incorporated herein by reference.

TECHNICAL FIELD

Embodiments of the present invention relate to a component carrier, a method of manufacturing a component carrier and a method of use.

BACKGROUND ART

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically reliable so as to be operable even under harsh conditions.

Moreover, the transmission of high-frequency signals propagating along wiring structures of a component carrier and between component carrier and a communication partner device may be challenging. On the one hand, transmission artefacts such as passive intermodulation can substantially degrade the overall performance of a component carrier with high-frequency functionality. At the same time, providing high-frequency functionality using component carriers such as printed circuit boards (optionally with one or more surface mounted or embedded high-frequency components) may involve long signal paths, which may introduce undesired phenomena such as deterioration of signal quality. Moreover, conventional high-frequency devices on the basis of printed circuit boards may have limitations in terms of size of a transmission line.

SUMMARY

There may be a need to enable high performance and high signal quality in terms of high-frequency signal transmission by a component carrier.

According to an exemplary embodiment of the invention, a component carrier is provided, wherein the component carrier comprises a stack comprising at least one electrically conductive layer structure and at least one electrically insulating layer structure, and a microwave structure embedded at least partially in the stack (and for instance being configured for exciting a microwave propagation mode), wherein the stack with the microwave structure is composed of at least two stack pieces being interconnected with each other at an electrically conductive connection interface.

According to another exemplary embodiment of the invention, a method of manufacturing a component carrier is provided, wherein the method comprises providing a stack comprising at least one electrically conductive layer structure and at least one electrically insulating layer structure, embedding a microwave structure (which may for example be configured for exciting a microwave propagation mode) at least partially in the stack, and interconnecting at least two stack pieces with each other at an electrically conductive connection interface, the at least two stack pieces forming the stack with the microwave structure.

According to still another exemplary embodiment of the invention, a component carrier having the above-mentioned features is used for a high-frequency application, in particular for conducting a radio frequency (RF) signal, in particular a RF signal with a frequency above 1 GHz.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "microwave" may denote electromagnetic radiation with frequencies in a range from 300 MHz to 400 GHz. According to exemplary embodiments, frequencies of at least 30 GHz may be preferred. Exemplary embodiments of the invention may operate in a frequency range up to 30 GHz and above as for example 400 GHz applications. However, THz applications are possible with exemplary embodiments of the invention as well.

In the context of the present application, the term "microwave structure" may particularly denote any electronic member integrated in a component carrier and having a function in terms of microwave conduction, microwave manipulation and/or microwaves processing. The microwave structure may comprise at least one functional element in terms of microwave processing (such as a waveguide, a suspended stripline, a coaxial line, a filter, a coupler, a splitter, a combiner, etc.).

In the context of the present application, the term "microwave structure configured for exciting a microwave propagation mode" may particularly denote a microwave structure as defined above and being further configured for enabling microwave propagation in accordance with at least one defined mode along at least part of a component carrier. For instance, such a microwave mode may be a transverse electromagnetic mode or a trans-verse electric mode.

In the context of the present application, the term "stack pieces" may particularly denote interconnected sub-portions of the component carrier which are initially separate layer stack bodies which are interconnected, either directly (for instance by thermocompression bonding) or by an electrically conductive connection medium (such a solder or sinter) in between, during manufacturing a component carrier. Hence, each of the stack pieces may be a pre-formed separate physical element, wherein different stack pieces of a component carrier to be manufactured may be provided matching to each other. Different stack pieces may be vertically stacked and interconnected for forming the stack. Interconnected stack pieces of a common stack may have the same shape and dimensions within a horizontal plane. After interconnection of multiple stack pieces for forming a common component carrier, an interface between initially separate stack pieces may still be visible in a cross-sectional view of the component carrier.

In the context of the present application, the term "electrically conductive connection interface" may particularly denote a connection area or a connection volume connecting multiple stack pieces with each other with a direct metal-metal transition and hence without dielectric material between the interconnected stack pieces at the electrically conductive connection interface. Thus, an uninterrupted electrically conductive path may be formed between interconnected stack pieces at their mutual electrically conductive connection interface. In one embodiment, the stack pieces may be connected with each other by at least one electrically conductive connection interface extending over an entire connection surface between the stack pieces around a microwave structure (compare for instance FIG. 1). In another embodiment, the stack pieces may be connected with each other by at least one electrically conductive connection interface extending over part of a connection surface between the stack pieces around a microwave structure, whereas an exterior part of the connection surface may be provided by a dielectric connection (compare for instance FIG. 2).

In the context of the present application, the term "high-frequency application" may particularly denote a task fulfilled by the component carrier or to which the component carrier contributes, wherein the task may relate to the handling of a radio frequency signal, in particular a microwave signal. Such a radio or high-frequency signal may be an electric or electromagnetic signal propagating along a wiring structure of the component carrier in a range of frequencies used for communications or other signals. In particular, a radio frequency (RF) signal may for example have a frequency in the range between 3 kHz and 300 GHz. In particular, high-frequency applications may involve microwave transmission, preferably in a frequency range of 30 GHz or more.

According to an exemplary embodiment of the invention, a component carrier (such as a printed circuit board, PCB) is provided which comprises a microwave structure integrated with a (preferably laminated) layer stack for conducting and/or processing microwave signals propagating along the component carrier and interacting with the microwave structure. Advantageously, the stack together with its microwave structure is formed by interconnecting a plurality of initially separate pre-formed stack pieces with at least one common electrically conductive connection interface in between. By connecting a plurality of pre-formed stack pieces, each contributing to the formation of the component carrier-integrated microwave structure, for creating a continuous electrically conductive path between the stack pieces, microwave leakage out of the microwave structure may be efficiently suppressed. By forming a continuous electrically conductive path which delimits the microwave structure partially or preferably entirely, low loss transmission and/or processing of microwaves may be ensured. At the same time, the described component carrier can be manufactured in a quick and simple way, by firstly processing each of the stack pieces individually, followed by a mutual interconnection forming an electrically conductive connection interface. Such a manufacturing concept is also compatible with a batch manufacture of multiple component carriers simultaneously, in particular on panel level in terms of PCB manufacture. Furthermore, exemplary embodiments of the invention may advantageously increase a size of a transmission line compared to conventional approaches (for instance waveguide versus microstrip).

In the following, further exemplary embodiments of the method and the component carrier will be explained.

In an embodiment, electrically conductive layer structures of the at least two stack pieces are directly interconnected with each other at the electrically conductive connection interface without an electrically conductive connection medium in between. Correspondingly, the method may comprise directly interconnecting electrically conductive layer structures of the at least two stack pieces with each other at the electrically conductive connection interface, in particular by thermal bonding. Thus, electrically conductive layer structures of stack pieces to be interconnected may be brought in direct physical contact with each other and may be merged to a common integral structure without providing an additional electrically conductive material in between. This may allow to manufacture a very compact component carrier with integrated microwave structure.

Preferably, the direct connection of electrically conductive surfaces of stack pieces to be joined may be created by thermocompression bonding. The term "thermocompression bonding" may denote a bonding technique in which two metals (such as copper and copper, or gold and gold, wherein also aluminum may be a proper choice) are brought into atomic contact applying force and heat simultaneously. Descriptively speaking, the atoms in direct physical contact may migrate from one crystal lattice to the other one, thereby exerting an atomic interaction which sticks the interfacing metal surfaces of the physically contacted stack pieces together. Copper may be particularly appropriate for thermocompression bonding in view of its soft and ductile properties, as well as its high diffusion rate.

In another embodiment, the at least two stack pieces are interconnected with each other by an electrically conductive connection medium which is different from the at least one electrically conductive layer structure. In a corresponding method, interconnecting the at least two stack pieces with each other is performed after applying an electrically conductive connection medium which is different from the at least one electrically conductive layer structure. Hence, an additional metallic medium may be provided for interconnecting electrically conductive layer structures of the stack pieces to be merged. Advantageously, said additional metallic medium will contribute to an uninterrupted continuous electrically conductive path between the stack pieces to be interconnected. Sandwiching an electrically conductive connection medium between the stack pieces to be interconnected for forming an uninterrupted metallic compound may further improve the robustness of the interconnection.

In an embodiment, the electrically conductive connection medium comprises at least one of the group consisting of a solder structure, a sinter structure, and an electrically conductive adhesive. Correspondingly, the method may comprise forming the electrically conductive connection medium by at least one of the group consisting of soldering (in particular diffusion soldering,) sintering (in particular using a sinter paste), and gluing (in particular using an electrically conductive adhesive). All the mentioned electrically conductive connection media may ensure an improved reliability of the manufactured component carrier, in particular in the event of thermal load or mechanical load. Furthermore, the mentioned electrically conductive connection media may be applied in an uncured way and can flow in tiny gaps between facing surfaces of electrically conductive layer structures of the different stack pieces for ensuring a continuous metallic connection path. Advantageously, electrically conductive connection medium may be reliably prevented from flowing into an air cavity of a microwave structure, for instance by adjusting process parameters (such as viscosity, temperature, pressure, etc.).

In an embodiment, the method comprises applying a solder-type electrically conductive connection medium by a galvanic process (or by another electroplating method) or by sputtering (in particular by physical vapor deposition, PVD). It is also possible that a solder-type electrically conductive connection medium is applied by an immersion process, or by hot air solder leveling. Sputtering may be denoted as a deposition process in which microscopic particles of a solid material are ejected from its surface, after the material is itself bombarded by energetic particles, for instance of a plasma or gas. For electroplating, and in particular galvanic plating, of electrically conductive material, water-based solutions or electrolytes may be used which contain metal to be deposited as ions (for example as dissolved metal salts). An electric field between a first electrode (in particular an anode) and the preform of the component carrier to be manufactured as second electrode (in particular a cathode) may force (in particular positively charged) metal ions to move to the second electrode (in particular cathode) where they give up their charge and deposit themselves as metallic material on the surface of a respective stack piece. For instance, a layer of tin may be applied in the thickness of for instance 3 µm to 5 µm and may then be cured by adding heat and pressure.

In an embodiment, the method comprises applying a solder-type electrically conductive connection medium as a multi-layer structure, for instance a double layer or a triple layer. Thus, a solder may also be applied as a multi-layer structure formed of different solder materials, so that optimized solder systems may be implemented.

In an embodiment, the method comprises applying a sinter-type electrically conductive connection medium by printing a paste. For example, a sinter paste may comprise sinter particles in a matrix of solvent, the latter evaporating at least partially during curing the sinter paste. Printing for applying a sinter paste may in particular be embodied by screen printing or inkjet printing. Further methods which can be used for applying the sinter paste besides printing methods (including screen printing, inkjet printing and 3D printing) are coating methods (such as spray coating, dip coating, etc.) and any other dispensing method. It is also possible that a sinter material is applied by jetting and/or dispensing.

In an embodiment, the electrically conductive connection medium may be applied as an electrically conductive adhesive. Such an electrically conductive adhesive may for instance be provided as one or more organic polymers mixed with metallic particles. It is however also possible to provide an electrically conductive adhesive with electrically conductive ceramic particles (for instance made of indium-tin-oxide, ITO). The mentioned examples combine a proper electric conductivity with a high thermal conductivity, so that the electrically conductive connection medium can also contribute to heat removal and/or heat spreading.

In an embodiment, the microwave structure comprises a waveguide (see for instance FIG. 1 to FIG. 4). In the context of the present application, the term "waveguide" may particularly denote a structure that guides waves, such as electromagnetic waves, with reduced loss of energy by restricting the transmission of energy to a limited number of directions, in particular, to one direction. Without the physical constraint of a waveguide, wave amplitudes decrease more quickly as they expand into the three dimensional space. For instance, a waveguide may be a (for instance hollow or dielectrically filled) conductive recess or cavity in a layer stack of a component carrier which may be used to carry high frequency radio waves. For instance, a cross-section of a metal-surrounded recess functioning as waveguide may be rectangular or circular. For instance, a signal may be coupled with a waveguide using a stripline, i.e., a transverse electromagnetic transmission line such as a planar transmission line. In particular, a signal may be coupled between waveguide and stripline at a waveguide-to-stripline transition. A waveguide may be hollow, for instance may be filled with air, or may be filled with a (preferably dielectric) material, such as a low DF material and/or a low or high DK material. In particular, a high DK with a very low DF material (for example low temperature co-fired ceramics, LTCC) may benefit the structure in terms of size as the size requirement to excite a waveguide mode would shrink by the square root of an effective value of DK. Hence, the DF properties may be even more relevant than the DK properties. Shape and dimensions of a waveguide may be adjusted in accordance with a signal frequency. Moreover, a waveguide may be adapted in order to fulfill a resonance condition for a signal.

Figure 25:
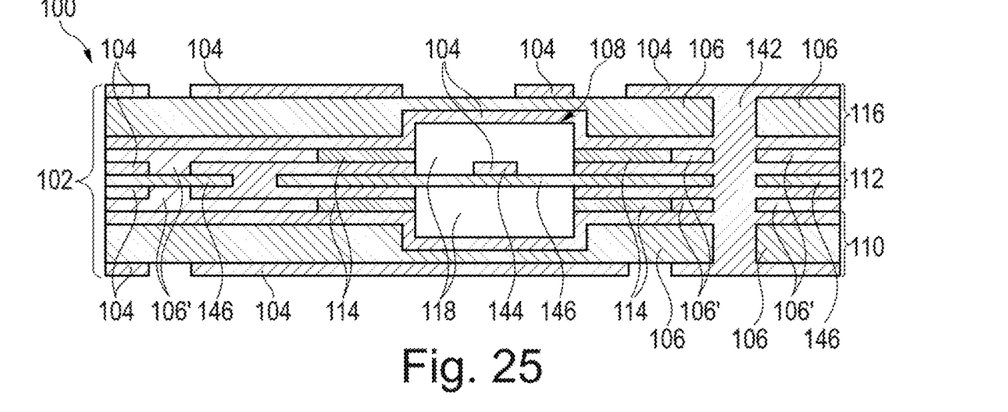
FIG. 25 illustrates a component carrier according to still another exemplary embodiment of the invention.

In an embodiment, the microwave structure comprises a suspended stripline (see for instance FIG. 25). In the context of the present application, the term "suspended stripline" may in particular denote an electrical planar transmission line by which an electric conductor (for example in the form of a thin metal strip) is suspended between two connection positions of the stack. Descriptively speaking, a suspended stripline may use air as dielectric. For instance, a conductor of a suspended stripline may be mount-ed on a low loss high-frequency dielectric strip or sheet hanging between mounting positions of a stack. The mechanical support of the suspended stripline may thus be the stack of the component carrier.

Figure 26:
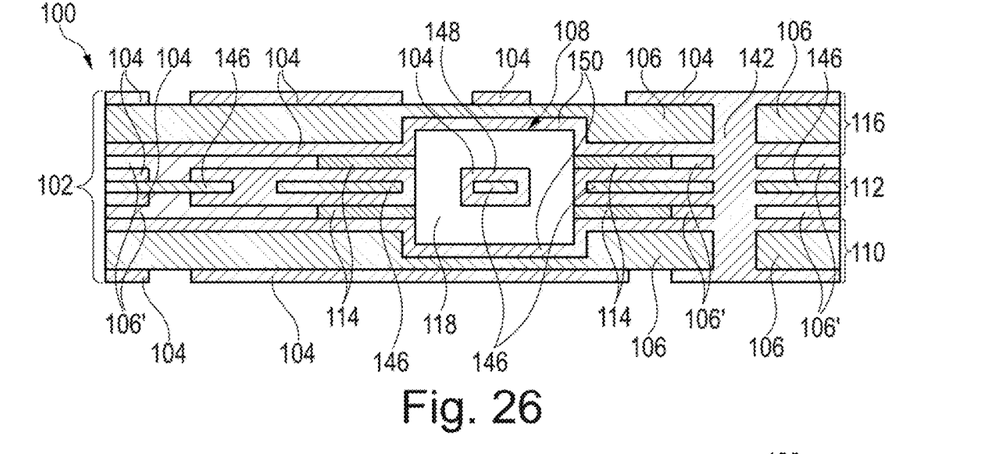
FIG. 26 illustrates a component carrier according to yet another exemplary embodiment of the invention.

In an embodiment, the microwave structure comprises coaxial lines (see for instance FIG. 26). A coaxial line for microwave applications may comprise two preferably concentric cylindrical conductors, the inner one being arranged in a cavity inside of the component carrier stack. For example, the outer one may be defined by electrically conductive layer structures of interconnected stack pieces surrounding the inner conductor and delimiting at least part of the cavity. The two conductors may be separated by air or a homogeneous dielectric material, preferably a low DF material. The loss (related to DF) of the material is the more relevant parameter, whereas DK is a parameter to adjust the capacity between the two conductors, thus shrinking the size requirements to meet a specific impedance of a coaxial line. A voltage between the inner and outer conductors may correspond to an electric field and the current in the conductors may produce a magnetic field.

In an embodiment, the microwave structure comprises a cavity (for in-stance an empty cavity) in an interior of the stack. An empty cavity may be an air-filled cavity. Such a cavity may contribute to the function of a respective microwave structure, such as a waveguide, a suspended stripline, or a coaxial line. Alternatively, the cavity may be filled with a low or high DK and/or low DF material. For instance, an appropriate low DK and low DF dielectric solid filling of a waveguide may be a ceramic or RO3003™ material, as commercialized by the Rogers Corporation of Chandler, Arizona, U.S.A. Another example of an appropriate material is LTCC (low temperature co-fired ceramics) or a RO3010™ material also commercialized by the Rogers Corporation (for instance with a DK of 10 and acceptable DF value).

In an embodiment, the cavity is substantially completely surrounded by electrically conductive material but has an opening for feeding a signal. Thus, the cavity may have an opening for the feed (i.e., excitation of the microwave structure). In a cross-section (depending whether or not the cross-section has been made at the location of the opening) the cavity is fully surrounded by the electrically conductive material. In such a preferred embodiment, almost the entire cavity is surrounded by a closed cage of electrically conductive, preferably metallic, material. This may keep microwave losses extremely small. When constituting the entire electrically conductive material completely delimiting the cavity of electrically conductive layer structures of the interconnected stack pieces and optionally electrically conductive connection medium in between, the separate formation of a cladding may be dispensable. This may significantly simplify the manufacturing process of the component carrier with integrated microwave structure.

In an embodiment, the cavity is fully delimited by a waveguide fence of the microwave structure.

In an embodiment, at least two sidewalls of the cavity are completely coated with electrically conductive material. By taking this measure, a signal input and a signal output may be created, for example a feeding line.

Descriptively speaking, if a sidewall of a cavity was not fully covered with electrically conductive material, waves or parts thereof can escape the waveguide. Thus, it may be advantageous to build a via or fence next to this area where only a dielectric material is present. In terms of manufacturing specification, this via should not be in closest proximity to the cavity, as this might cause the cavity to collapse. Thus, more area may be used for implementing a waveguide functionality in conventionally manufactured embedded hollow waveguides. Hence, exemplary embodiments of the invention may contribute to the trend of continued miniaturization.

In an embodiment, the component carrier comprises a microwave signal conduction path for conducting microwave signals from and/or to the microwave structure which extends substantially straight, in particular along at least one sidewall of at least one of the stack and a cavity of the microwave structure. Preferably, the signal path is as short as possible, for example directly along the sidewalls.

In the following, different technologies will be described which may be used according to exemplary embodiments for forming a cavity.

In an embodiment, the method comprises embedding a release layer in a stack piece, and thereafter forming an opening in the stack piece by forming a circumferential cut for removing a portion of the stack piece which is delimited at a bottom side by the release layer. For instance, such a release layer may be made of a material showing poorly adhesive properties with respect to surrounding stack piece material. For instance, an appropriate material for the release layer is polytetrafluoroethylene (PTFE, Teflon®), or a waxy compound. Teflon® is a registered mark of The Chemours Company FC LLC of Wilmington, Delaware, U.S.A. The method may comprise forming a circumferential cutting trench in the stack piece extending up to the release layer to thereby separate the portion from a rest of the stack piece. Cutting said trench may be accomplished for example by laser drilling or mechanically drilling.

In another embodiment, the method comprises forming a cavity in the stack piece by routing (preferably depth routing). Routing is an appropriate and simple mechanism of precisely defining a blind hole-type opening for subsequently completing formation of the microwave structure.

In yet another embodiment, a through hole may be formed in one stack piece, and the through hole may be closed at the bottom side and/or at a top side by connecting a continuous stack piece.

Preferably, a solder-type electrically conductive connection medium has a thickness in a range from 0.25 µm to 10 µm, in particular in a range from 1 µm to 5 µm. In an embodiment, the thickness may also be in a range from 0.5 µm to 10 µm, in particular in a range from 0.5 µm to 5 µm.

Alternatively, a sinter-type electrically conductive connection medium may have a thickness in a range from 5 µm to 70 µm, in particular in a range from 30 µm to 60 µm. Said thickness may also be in a range from 5 µm to 100 µm, in particular in a range from 20 µm to 100 µm. In particular, a sinter-type electrically conductive connection medium may be formed preferably by dispensing or inkjet printing. Alternatively, it may also be formed by screen printing. Depending on the application, the thickness may be adjusted. For example, when forming the sinter-type electrically conductive connection medium by inkjet printing, the thickness may be in a range from 5 µm to 30 µm. When forming the sinter-type electrically conductive connection medium by stencil printing, the thickness may be in a range from 30 µm to 60 µm.

A correspondingly small material volume of the electrically conductive connection medium may keep the entire component carrier compact, in particular in vertical direction.

Advantageously, the process of interconnecting the electrically conductive layer structures of connected stack pieces by the thin film type electrically conductive connection medium in between may also involve a contribution of interdiffusion. Descriptively speaking, interdiffusion may form an alloy within an electrically conductive connection medium comprising different metals (for instance copper and tin) and/or between the electrically conductive connection medium and the electrically conductive layer structures of the stack pieces.

In an embodiment, the microwave structure is composed of at least three stack pieces being interconnected with each other by at least two spaced sub-structures of the electrically conductive connection interface, in particular by at least two spaced sub-structures of an electrically conductive connection medium. In particular, a central stack piece may be connected at its bottom side with a first sub-structure of the electrically conductive connection medium with a bottom-sided stack piece. Moreover, said central stack piece may be connected at its top side with a second sub-structure of the electrically conductive connection medium with a top-sided stack piece. Even more than three stack pieces may be interconnected in accordance with the described principle using three or more sub-structures of the electrically conductive connection medium. When omitting electrically conductive connection medium, an electrically conductive layer structure of the central stack piece may be connected directly with an electrically conductive layer structure of the top-sided stack piece, and another electrically conductive layer structure of the central stack piece may be connected directly with an electrically conductive layer structure of the bottom-sided stack piece. For instance, a two-sided direct connection of the central stack piece may be accomplished by thermocompression bonding. Also in the latter case, more than three stack pieces may be interconnected.

In another embodiment, the microwave structure is composed of only two stack pieces being interconnected with each other by one electrically conductive connection interface. In such embodiments, only a single electrically conductive connection medium or a single thermocompression bonding may be sufficient for interconnecting the two stack pieces.

In an embodiment, the microwave structure is exteriorly delimited substantially by circumferentially closed side walls consisting substantially exclusively of electrically conductive material. In other words, the microwave structure may be exteriorly delimited by circumferentially closed sidewalls constituted exclusively of electrically conductive material, unless wanted, to avoid microwave leakage. Thus, there may be one or more wanted openings in the shielding of the cavity in order to feed the signal into the cavity. In particular, one or more openings for an input and/or output of a microwave signal may be present at the microwave structure. For example, a microwave signal may be supplied to the structure (for example waveguide feeds like a microstrip or stripline to waveguide transition, a feeding slot (opening in the top or bottom of the waveguide) or an antenna dipole being placed inside the waveguide). For example, in the case of suspended stripline substrates, the signal may be carried by a copper conductor that is placed on a substrate carrier and passes through a hole in the copper plated side walls. That hole ensures that the signal is not shorted when penetrating the shielding of the cavity. Said electrically conductive material may correspond to electrically conductive layer structures of the interconnected stack pieces, and optionally an electrically conductive connection medium in between. Such a lateral metallic cage structure may avoid microwave leakage through the vertical sidewalls delimiting a cavity of the integrated microwave structure. This may enable a low loss processing of RF signals by the component carrier.

In an embodiment, the microwave structure is exteriorly delimited by closed top and bottom walls consisting exclusively of electrically conductive material. Said electrically conductive material may correspond to electrically conductive layer structures of the interconnected stack pieces. Avoiding microwave leakage out of the cavity of the integrated microwave structure in a vertical direction may also contribute to a low loss processing of RF signals by the component carrier.

Advantageously, the two previously described embodiments may be combined to thereby obtain a microwave structure being hermetically surrounded or delimited by electrically conductive material, i.e., from the electrically conductive layer structures of the stack pieces, and optionally from interconnecting electrically conductive connection medium. This allows to obtain excellent high-frequency properties of the component carrier.

In an embodiment, electrically conductive material delimiting a cavity of the microwave structure partially or preferably entirely may be a magnetic material, in particular a permanent magnetic material. This may equip the component carrier with a magnetic shielding function.

In an embodiment, the method comprises interconnecting two or more panels, having a plurality of preforms of component carriers, at electrically conductive connection interfaces, and thereafter separating the interconnected panels into a plurality of separate component carriers. Hence, the described manufacturing architecture can be executed on panel level, and consequently with a high throughput on an industrial scale.

In an embodiment, the method comprises, after the applying and before the interconnecting, increasing viscosity of a sinter-type electrically conductive connection medium, in particular by pre-drying. To enable application of the sinter-type electrically conductive connection medium by printing, a certain viscosity is desired which shall not be too small. After application and before curing, the sinter paste may be advantageously pre-dried. By pre-drying sinter paste prior to establishing the interconnection between the stack pieces, it may be reliably prevented that sinter material unintentionally flows into an air cavity of the microwave structure during interconnection. Hence, it may be ensured that the function of the microwave structure is not compromised by the interconnection process. Pre-drying the sinter paste may be accomplished by pre-heating the sinter paste before curing, to thereby remove part of an organic matrix (in particular to evaporate at least part of solvent thereof) and thus increase viscosity.

In an embodiment, the method comprises interconnecting the at least two stack pieces additionally by curing an at least partially uncured electrically insulating layer structure, in particular a resin structure or a prepreg structure. In order to further improve mechanical integrity of the component carrier, the connection area between different interconnected stack pieces may be partially formed by resin interconnecting the stack pieces by lamination. If such an uncured resin is applied between stack pieces to be inter-connected and apart from the electrically conductive connection interface to be formed, an additional dielectric connection area may be formed by curing the resin. This may be accomplished by lamination, i.e., the application of pressure and/or heat. The previously at least partially uncured resin (for example epoxy resin) may become flowable, may start cross-linking or polymerizing, and may then be re-solidified in a cured state for contributing to the connection between stack pieces.

In an embodiment, the method comprises forming the microwave structure by connecting an intermediate structure having a through hole between a continuous bottom structure and a continuous top structure. Such an embodiment is shown in FIG. 6 to FIG. 11 and allows the formation of a cavity-type microwave structure with very simple top and bottom structures as well as an intermediate structure in between in which a through hole may be formed. FIG. 6 to FIG. 11 show structured top and bottom layers of the waveguide that would allow an excitation of the waveguide. Additionally, any feeding type may be implemented, as known by those skilled in the art.

In an alternative embodiment, the method comprises forming the microwave structure by connecting a bottom structure having a blind hole with a continuous top structure. A cavity-type microwave structure may be formed using only two stack pieces when creating a blind hole in one of them. The bottom structure and the top structure may be interchanged, so that the blind hole may also be formed in the top structure rather than in the bottom structure, or in both.

In an embodiment, the component carrier is used for high-frequency applications above 1 GHz, in particular above 30 GHz. In particular for such high frequencies, signal transmission is particularly sensitive to surface roughness. A high performance of component carriers according to exemplary embodiments of the invention allows low loss signal transmission even with such high-frequency values.

Although not shown in the figures, at least one surface mounted and/or embedded component may be provided, for instance an RF chip. Such a component may be functionally coupled with the integrated microwave structure. It is also possible to provide further electronic components, such as at least one antenna for signal transmission. It is also possible to integrate a plurality of microwave structures in one and the same component carrier.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame-retardant properties. Although prepreg particularly FR4 are usually preferred for rigid PCBs, other materials, in particular epoxy-based build-up materials (such as build-up films) or photoimageable dielectric materials, may be used as well. For high-frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly (3,4-ethylenedioxythiophene) (PEDOT), respectively.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

The illustrations in the drawings are schematically presented. In different drawings, similar or identical elements are provided with the same reference signs.

Before referring to the drawings, exemplary embodiments will be de-scribed in further detail, some basic considerations will be summarized based on which exemplary embodiments of the invention have been developed.

According to an exemplary embodiment of the invention, a laminated layer stack-type component carrier (such as a PCB) with high-frequency microwave functionality is provided. Furthermore, a microwave structure may be embedded in a corresponding laminated layer stack. Advantageously, the microwave structure may be composed of two or more prefabricated stack pieces which are interconnected with each other at an electrically conductive connection interface. Consequently, a continuous electrically conductive connection is formed at the interface between the interconnected stack pieces, which advantageously suppresses undesired leakage of microwaves out of the microwave structure. A preferred embodiment of the invention may be a PCB embedded waveguide manufactured accordingly. Thus, an electrically conductive interconnection approach may be implemented to form PCB embedded waveguides and other high-frequency component carriers. In particular, an exemplary embodiment of the invention may create a high-performance RF passive structure utilizing air cavities by shortening opposing metal layers on purpose. More specifically, an exemplary embodiment of the invention may form an electrically conductive inter-connection between two opposing layers to form a high-performance RF passive structure. Thus, an exemplary embodiment of the invention may enable high-performance high-frequency signal distribution networking with the option of providing additional RF functionality.

According to exemplary embodiments of the invention, there may be no need to build up a separate copper wall if an electrically conducting interconnection medium is used for interconnecting prefabricated stack pieces. Several realizations without a separate copper wall are possible. Advantageously, a panel wide metallic interconnection between corresponding layers may be formed, for example by diffusion soldering (in particular with a thickness of a solder-type electrically conductive connection medium in a range from 0.5 μm to 10 μm). Also, a partial metallic interconnection between the mentioned stack pieces is possible, for instance a connection using a sinter paste in combination with a connection based on prepreg.

Exemplary embodiments of the invention have advantages. Firstly, there is no need for an additional copper wall build-up. Consequently, ultra-low loss interconnections may be created. Furthermore, a low loss interconnection may be achieved in particular at frequencies above 20 GHz due to space constraints, and a lower loss interconnection in comparison with conventional PCB-based transmission lines. Exemplary embodiments of the invention may be particularly preferred for RF feeding networks of antennas, and for antennas itself. Moreover, low loss and/or high-performance passive components may be created by exemplary embodiments of the invention (for example filter structures). Apart from this, the manufacturing effort may be reduced, since expensive low loss prepreg materials can be avoided. Also, low profile materials can be avoided by exemplary embodiments. Advantageously, it may be ensured that electromagnetic waves remain only inside a waveguide or other type of microwave structure.

Exemplary applications of exemplary embodiments of the invention are RF-type component carriers, such as radar sensors, component carriers for 5G, 6G, IoT (Internet of Things), or AIM products (such as 5G base stations, automotive radar, etc.).

A gist of an exemplary embodiment of the invention is to create an interconnection between two opposing metal layers for the purpose of enabling the transmission of a high-frequency low loss propagation mode in a PCB that makes use of air cavities. Signal loss of a PCB can be drastically improved by utilizing air cavities. Ideally, the cavities are created in a way to form electrical waveguides. Therefore, it is advantageous to form a completely metalized cage (preferably having one or more openings for waveguide feed) around an air cavity that can have various shapes to form electromagnetic functioning passive components (such as filters, couplers, splitters, combiners, etc.). Several embodiments of forming electrical interconnections between two inner layers without using via or plated through hole processes will be explained below referring to the figures. In particular, exemplary embodiments may use copper clads that are pressed together to form an electrical connection, or deposing a sinter paste on a clad, or copper pillars, etc.

According to an exemplary embodiment of the invention, a separate cladding may be dispensable when forming an electrical connection between two opposing layers of interconnected stack pieces with a connection that may be very short. For example, it may be possible to apply a sinter paste as thin as possible and either form a very thick copper layer or precut the prepreg and dispense a conductive interconnection paste only in necessary areas.

Exemplary embodiments of the invention cannot only be applied to form waveguide structures, but also for forming other microwave structures exciting a microwave propagation mode that benefits from a direct electrical connection between two opposing layers. Advantageously, this may be possible without the need for vias, plated through holes, etc. Other microwave structures which can be formed according to exemplary embodiments of the invention are suspended stripline substrates or PCB embedded coaxial lines (in particular empty substrate integrated coaxial lines).

Figure 1:
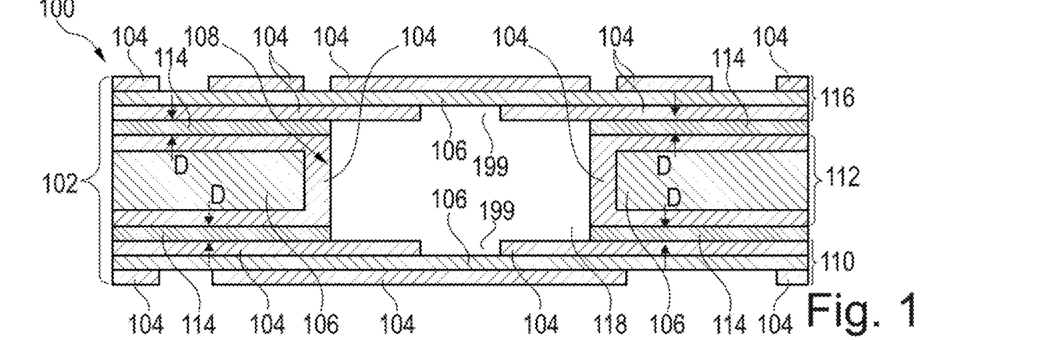
FIG. 1 illustrates a component carrier according to an exemplary embodiment of the invention.

FIG. 1 illustrates a component carrier 100 according to an exemplary embodiment of the invention.

The illustrated component carrier 100 may be a plate-shaped laminate-type component carrier, such as a printed circuit board (PCB). FIG. 1 shows a laminated stack 102 which is composed of electrically conductive layer structures 104 and electrically insulating layer structures 106. For example, the electrically conductive layer structures 104 may comprise patterned copper foils and/or vertical through-connections, for example copper filled laser vias. The electrically insulating layer structures 106 may comprise a resin (such as epoxy resin), optionally comprising reinforcing particles therein (for instance glass fibers or glass spheres). For instance, the electrically insulating layer structures 106 may be made of FR4. Several of the layer structures 104, 106 may be connected by lamination, i.e., the application of pressure and/or heat. In view of the configuration of the component carrier 100 described in the following, it is particular appropriate for high-frequency applications.

Moreover, the component carrier 100 according to FIG. 1 comprises a microwave structure 108 embedded in the stack 102 and being configured for exciting microwave propagation. More specifically, the shown microwave structure 108 is embodied as waveguide for guiding microwaves.

Advantageously, the stack 102 with the microwave structure 108 is composed of three prefabricated stack pieces 110, 112, 116 which have been interconnected with each other at two electrically conductive connection interfaces. A first electrically conductive connection interface is formed between bottom-sided first stack piece 110 and central second stack piece 112. A second electrically conductive connection interface is formed between central second stack piece 112 and top-sided third stack piece 116. More specifically, the stack pieces 110, 112, 116 are interconnected with each other at the described electrically conductive connection interfaces by an electrically conductive connection medium 114 which is provided in addition to the electrically conductive layer structures 104 of the individual stack pieces 110, 112, 116. For example, the electrically conductive connection medium 114 creating the electrically conductive connections at the above-described electrically conductive connection interfaces may be a solder structure or a sinter structure. When using a solder-type electrically conductive connection medium 114, each of its sub-structures may preferably have a thickness D in a range from 0.5 μm to 5 μm. When implementing a sinter-type electrically conductive connection medium 114, a thickness D of each of its sub-structures may be preferably in a range from 20 μm to 100 μm.

As shown in FIG. 1, the microwave structure 108 comprises an empty cavity 118 in an interior of the stack 102. As shown as well, the empty cavity 118 is substantially completely surrounded by electrically conductive material. In other words, the cavity 118 is surrounded by a metallic cage. More specifically, the cavity-based microwave structure 108 embodied as waveguide is exteriorly delimited by circumferential vertical side walls consisting exclusively of electrically conductive material. Furthermore, said microwave structure 108 is exteriorly delimited by top and bottom walls of electrically conductive material. Substantially the entire microwave structure 108 may be delimited by copper.

However, one or more feed openings 199 may be provided in the circumferential metal cage, preferably at the top and/or bottom wall. The one or more openings 199 may be the only interruption of the metal cage surrounding the cavity 118. In other words, the metal cage may surround the cavity 118 hermetically, with the only exception of the one or more feed openings 199. Said one or more feed openings 199 may be formed in a top wall and/or in a bottom wall of the metallic cage. In particular, sidewalls delimiting the cavity 118 may be fully covered by an electrically conductive medium such as copper.

As shown, the various electrically conductive layer structures 104 of all three stack pieces 110, 112, 116 form respective thick copper layers connected with preferably thin sinter material or solder paste. Structuring of the interconnected electrically conductive layer structures 104 is possible.

According to a FIG. 1, cavity 118 may be formed by a through hole in stack piece 112, whereas stack pieces 110, 116 may be continuous.

Figure 2:
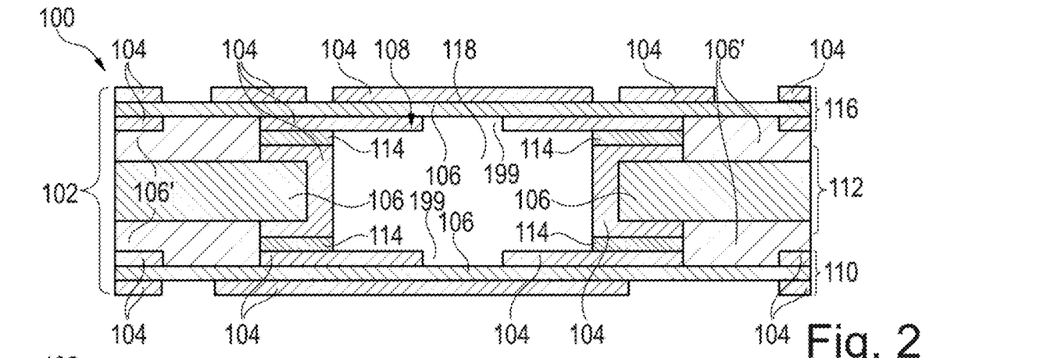
FIG. 2 illustrates a component carrier according to another exemplary embodiment of the invention.

FIG. 2 illustrates a component carrier 100 according to another exemplary embodiment of the invention.

The embodiment of FIG. 2 differs from the embodiment of FIG. 1 in particular in that, according to FIG. 2, the stack pieces 110, 112, 116 are additionally interconnected by curing initially uncured electrically insulating layer structures 106'. One initially uncured electrically insulating layer structure 106' is arranged between the first stack piece 110 and the second stack piece 112 partly at the vertical level of the respective sub-structure of electrically conductive connection medium 114, but circumferentially surrounding said substructure of electrically conductive connection medium 114. The other initially uncured electrically insulating layer structure 106' is arranged between the second stack piece 112 and the third stack piece 116 partly at the vertical level of the respective sub-structure of electrically conductive connection medium 114, but almost entirely circumferentially surrounding said sub-structure of electrically conductive connection medium 114. The initially uncured electrically insulating layer structures 106' may be for example epoxy resin or prepreg, which may be connected between the respective stack pieces 110/112, 112/116 by lamination for curing, i.e., by the application of heat and/or pressure. Thus, the connection between the stack pieces 110, 112, 116 in a region directly surrounding microwave structure 108 may be purely electrically conductive thanks to the electrically conductive layer structures 104 of the adjacent stack pieces 110, 112, 116 and thanks to the electrically conductive connection medium 114 in between, and may be electrically insulating in a laterally exterior region with respect to the electrically conductive connection medium 114 due to the electrically insulating layer structures 106'. The additional provision of electrically insulating layer structures 106' may further strengthen intra-layer adhesion within component carrier 100 without compromising on high-frequency performance, i.e., without the risk of leakage of microwaves out of the cavity 118.

According to FIG. 2, some of the layers may be removed except for the waveguide areas to enable routing capabilities on the other respective layers.

Figure 3:
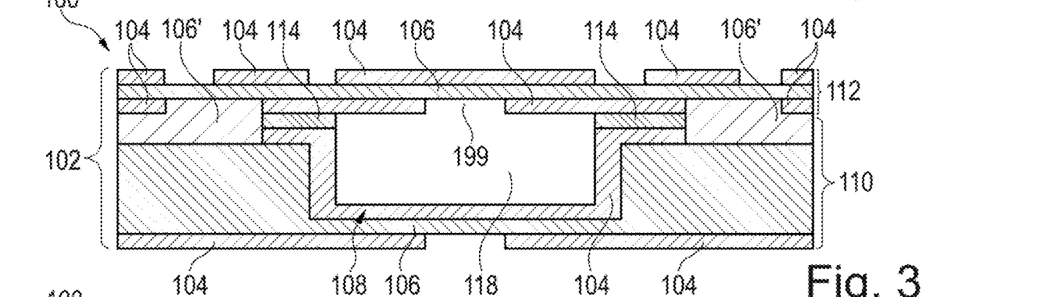
FIG. 3 illustrates a component carrier according to still another exemplary embodiment of the invention.

FIG. 3 illustrates a component carrier 100 according to still another exemplary embodiment of the invention.

The embodiment of FIG. 3 differs from the embodiment of FIG. 2 in particular in that, according to FIG. 3, only two stack pieces 110, 112 are interconnected, so that the electrically conductive connection medium 114 is only present at one vertical level and the initially uncured and later cured electrically insulating layer structure 106' is only present at one vertical level.

According to FIG. 3, cavity 118 may be formed by a blind hole in stack piece 110, whereas stack piece 112 may be continuous.

For forming such a blind hole, the above-described concept with an embedded poorly adhesive structure may be applied. This leads to a cross-section with a U-shaped recess in stack piece 110, instead of completely cutting one thick core (as may be done in FIG. 1 and FIG. 2). Additionally, the lid (forming a top wall of component carrier 100 according to FIG. 3) of the waveguide, i.e., stack piece 112, can be structured without a selective structuring process applied at the bottom of the waveguide.

Figure 4:
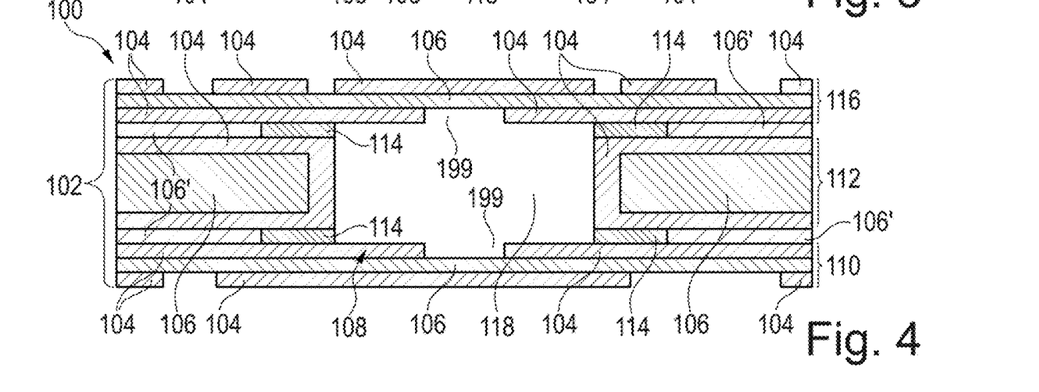
FIG. 4 illustrates a component carrier according to yet another exemplary embodiment of the invention.

FIG. 4 illustrates a component carrier 100 according to yet another exemplary embodiment of the invention.

The embodiment of FIG. 4 differs from the embodiment of FIG. 2 in particular in that, according to FIG. 4, the vertical extension of the electrically conductive connection medium 114 matches with the vertical extension of the additional previously uncured electrically insulating layer structures 106'.

Figure 5:
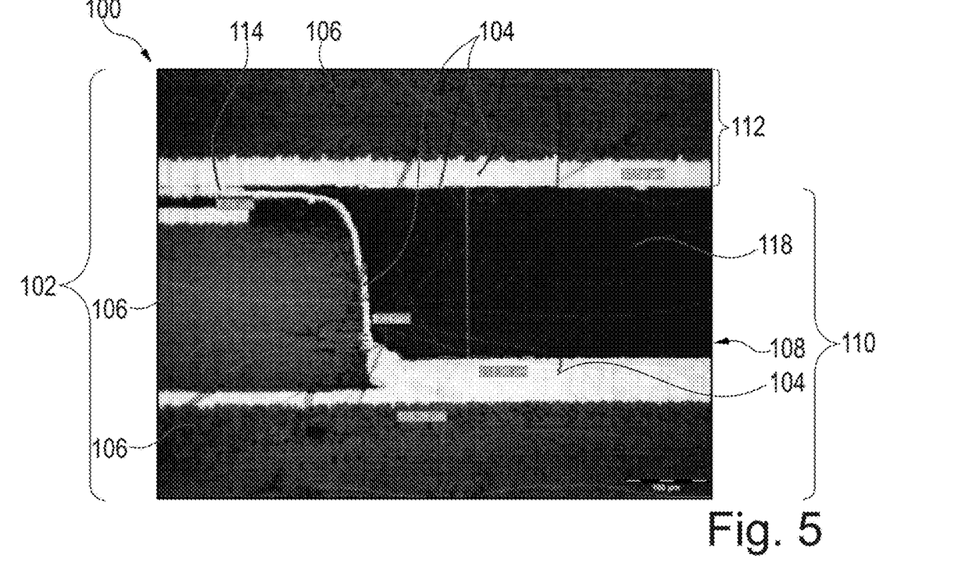
FIG. 5 is an image of a component carrier according to yet another exemplary embodiment of the invention.

FIG. 5 is an image of an actually manufactured component carrier 100 according to yet another exemplary embodiment of the invention. Electromagnetic radiation can propagate in microwave structure 108. FIG. 5 illustrates a waveguide with an additional wall being built up. According to other exemplary embodiments of the invention, such an additional wall may be omitted to further reduce the manufacturing effort.

Figures 6, 7:
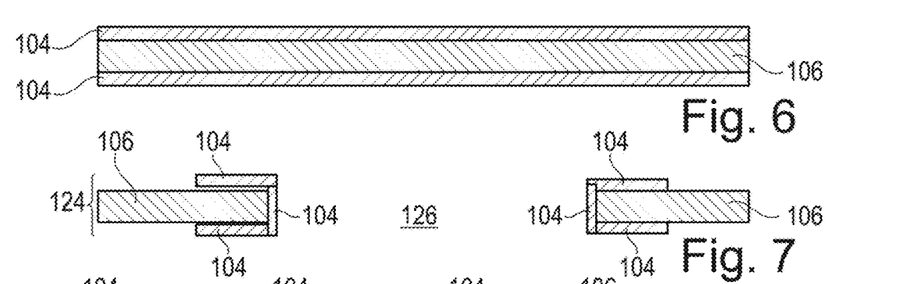
FIG. 6, FIG. 7, FIG. 8, FIG. 9, FIG. 10, and FIG. 11 illustrate cross-sectional views of structures obtained during carrying out a method of manufacturing a component carrier according to an exemplary embodiment of the invention, shown in FIG. 11.
Figure 8:
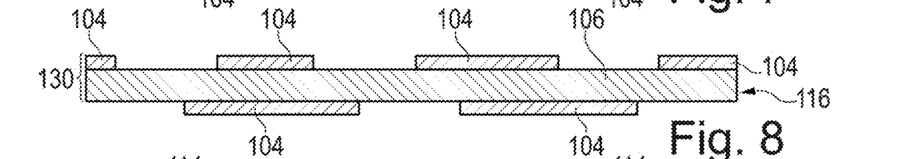
Figure 9:
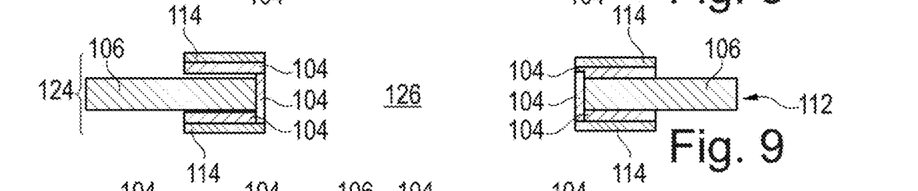
Figure 10:
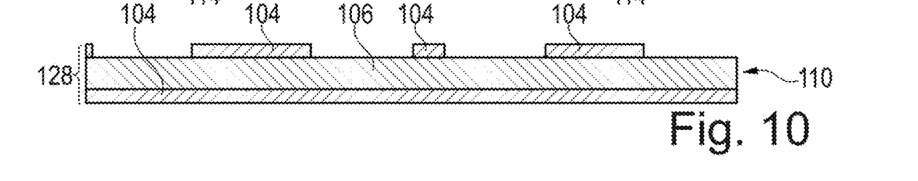
Figure 11:
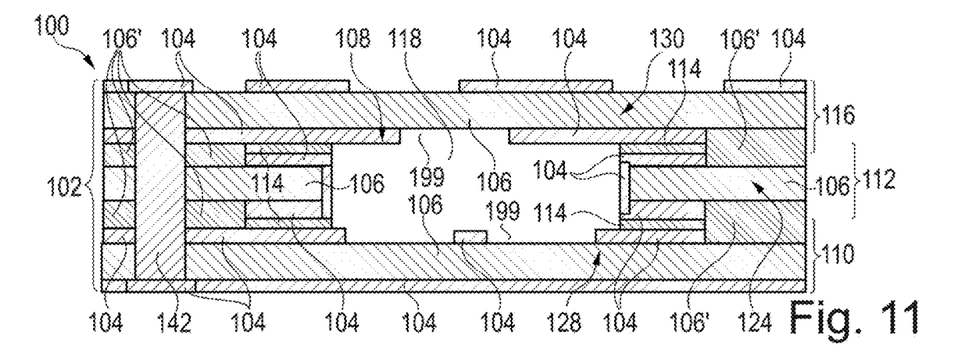

FIG. 6 to FIG. 11 illustrate cross-sectional views of structures obtained during carrying out a method of manufacturing a component carrier 100 according to an exemplary embodiment of the invention, shown in FIG. 11. A waveguide carrier core, shown in FIG. 6, is stripped from its copper layers. As shown in FIG. 7, a through hole 126 is cut and metallized (in particular with restring for copper plating). A top closing lid (shown as continuous top structure 130) and a bottom closing lid (shown as continuous bottom structure 128) are prepared, as shown in FIG. 8 and FIG. 10, and may be in particular structured to form a feeding input and output (see reference sign 199 in FIG. 11). In embodiments of the invention, a feeding input and/or output may be formed as the only opening(s) in a metal structure completely surrounding a cavity 118 formed based on through hole 126. A prepreg may be applied as still uncured electrically insulating layer structure 106', see FIG. 11. A conductive interconnection paste is applied as electrically conductive connection medium 114. For instance, the latter may be applied on the two opposing interfaces of intermediate structure 124, as shown in FIG. 9. Alternatively, the electrically conductive connection medium 114 may be applied to continuous bottom structure 128 and/or continuous top structure 130 (not shown). Preferably, the uncured electrically insulating layer structure 106' and the electrically conductive connection medium 114 may be of similar height. One of the copper layers may be removed on each side. The three cores shown with reference signs 124, 128, 130 are pressed together and can be structured later on. As shown in FIG. 11, formation of a metallized vertical through connection 142 extending through all stack pieces 110, 112, 116 and being here embodied as plated through hole is optionally possible.

Consequently, microwave structure 108 configured for exciting a microwave propagation mode is embedded in the stack 102 and is formed based on the electrically conductive layer structures 104, through hole 126 and electrically conductive connection medium 114. The shown three stack pieces 110, 112, 116 (corresponding to structures 128, 124, 130) of the microwave structure 108 are interconnected at an electrically conductive connection interface in form of electrically conductive connection medium 114 provided in addition to the electrically conductive layer structures 104. For instance, the electrically conductive connection medium 114 may be formed by diffusion soldering, sintering using a sinter paste, or gluing using an electrically conductive adhesive. When a solder-type electrically conductive connection medium 114 is used, it can be applied by a galvanic process or by sputtering. A sinter-type electrically conductive connection medium 114 may be applied by printing a sinter paste. After the applying and before the interconnecting of a sinter paste-type electrically conductive connection medium 114, its viscosity may be increased by pre-drying to meet simultaneously demands in terms of printability and protection against undesired flow of sinter paste into cavity 118.

In terms of interconnecting the stack pieces 110, 112, 116 by sintering or soldering, the initially uncured electrically insulating layer structure 106' may be cured as well. Curing electrically conductive connection medium 114 and electrically insulating layer structures 106' may be carried out sequentially or simultaneously.

The microwave structure 108 may be formed by connecting the inter-mediate structure 124 (having through hole 126) between continuous bottom structure 128 and continuous top structure 130.

Figure 13:
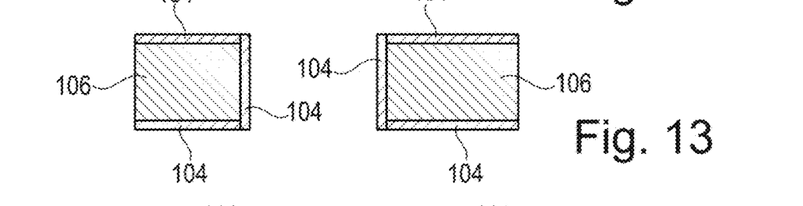
Figure 14:
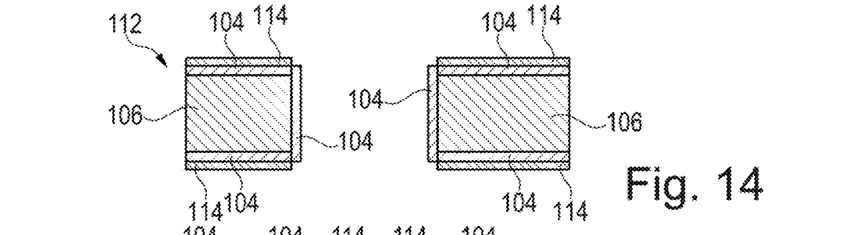
Figure 15:
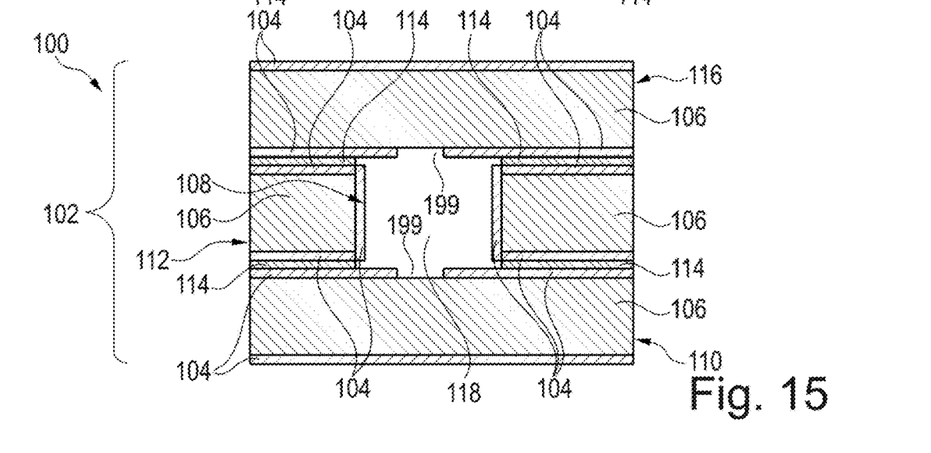

FIG. 12 to FIG. 16 illustrate cross-sectional views of structures obtained during carrying out a method of manufacturing a component carrier 100 according to an exemplary embodiment of the invention, shown in FIG. 15.

Figure 12:
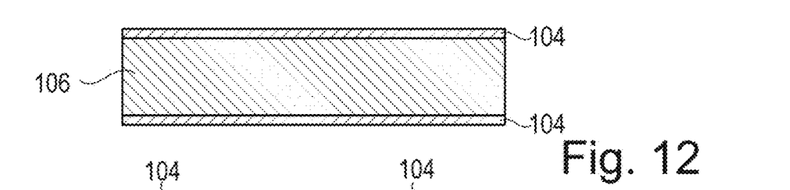
FIG. 12, FIG. 13, FIG. 14, FIG. 15, and FIG. 16 illustrate cross-sectional views of structures obtained during carrying out a method of manufacturing a component carrier according to an exemplary embodiment of the invention, shown in FIG. 15.
Figure 16:
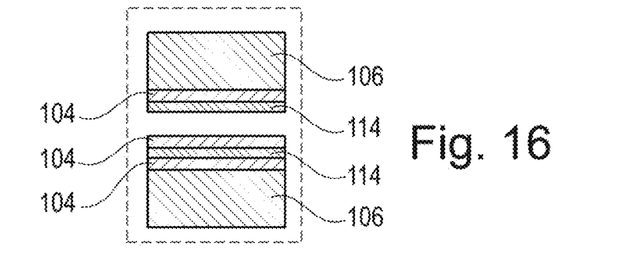

FIG. 12, FIG. 13, and FIG. 14 substantially correspond to FIG. 6, FIG. 7, and FIG. 9, respectively, as described above. FIG. 15 shows a component carrier 100 obtained by interconnecting stack piece 112 according to FIG. 14 between two stack pieces 110, 116 obtained by patterning an electrically conductive layer structure 104 on a respective main surface of a structure corresponding to FIG. 12. FIG. 16 indicates a possibility to build up multiple diffusion layers which may improve adhesion and/or enhance diffusion. Interconnection of component carrier 100 according to FIG. 15 may be accomplished by diffusion soldering. Appropriate may be a tin height in a range from 3 μm to 10 μm, for instance 5 μm. Preferably, a roughness of the interconnected surfaces shall be low so that enough surface area contact can be established between the two joining surfaces.

As an alternative to the described embodiment of FIG. 12 to FIG. 16, the electrically conductive connection medium 114 may be formed based on sinter paste rather than based on a solder. Preferably, the sinter paste height may be in a range from 5 μm to 100 μm. After having applied the sinter paste, the stack-up may be pressed. If paste heights lower than 50 μm are desired, screen printing or dispensing may be carried out.

Figure 20:
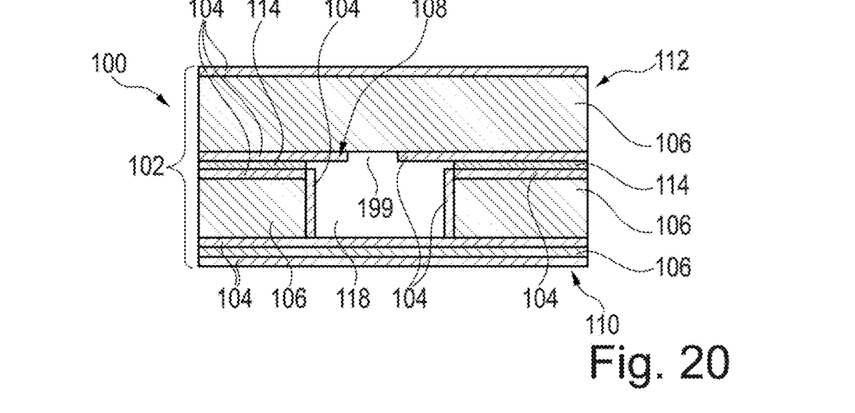
Figure 21:
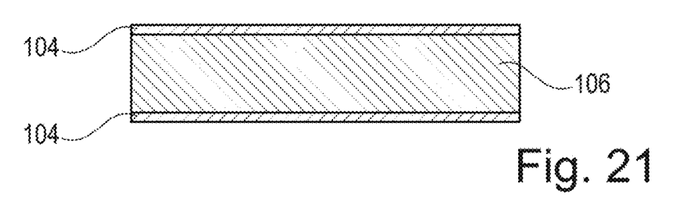
FIG. 21, FIG. 22, FIG. 23, and FIG. 24 illustrate cross-sectional views of structures obtained during carrying out a method of manufacturing a component carrier according to an exemplary embodiment of the invention, shown in FIG. 24.
Figure 22:
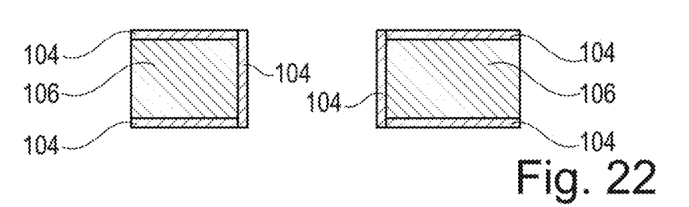
Figure 23:
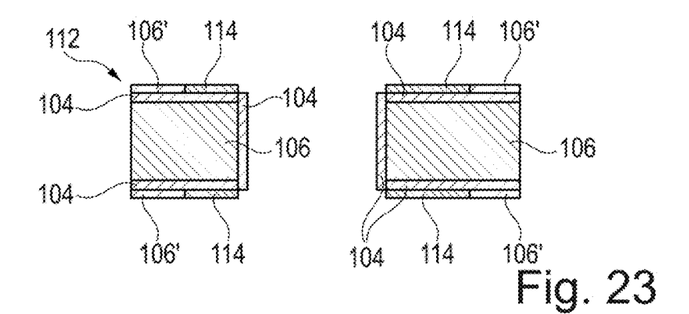

FIG. 17 to FIG. 20 illustrate cross-sectional views of structures obtained during carrying out a method of manufacturing a component carrier 100 according to an exemplary embodiment of the invention, shown in FIG. 20.

Figure 17:
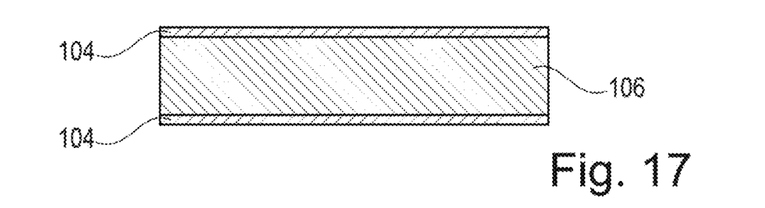
FIG. 17, FIG. 18, FIG. 19, and FIG. 20 illustrate cross-sectional views of structures obtained during carrying out a method of manufacturing a component carrier according to an exemplary embodiment of the invention, shown in FIG. 20.
Figure 18:
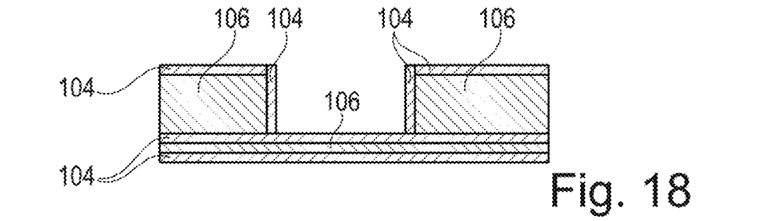
Figure 19:
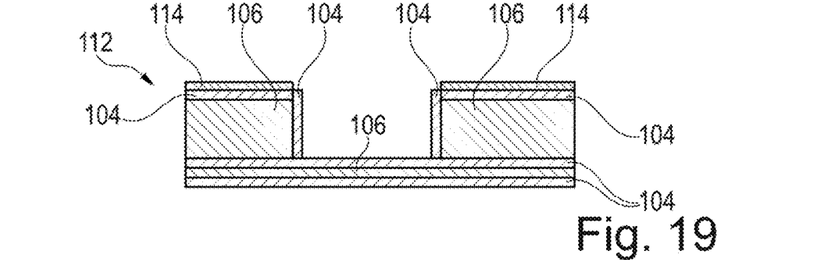

A difference between the embodiment of FIG. 17 to FIG. 20 compared to the embodiment of FIG. 12 to FIG. 16 is that, in the embodiment of FIG. 17 to FIG. 20, only two stack pieces 110, 112 (rather than three stack pieces 110, 112, 116) are interconnected for forming a waveguide-type microwave structure 108. FIG. 17 corresponds to FIG. 12. FIG. 18 may be obtained based on FIG. 13 by closing a bottom of the through hole with additional continuous layer structures 104, 106. According to FIG. 19, an electrically conductive connection medium 114 is formed on the upper main surface of the structure shown in FIG. 18. In the component carrier 100 according to FIG. 20, the stack pieces 110, 112 shown in FIG. 19 and in FIG. 17 (after patterning) may be interconnected by diffusion soldering.

As an alternative to the described embodiment of FIG. 17 to FIG. 20, the electrically conductive connection medium 114 may be formed based on sinter paste rather than based on a solder material.

Figure 24:
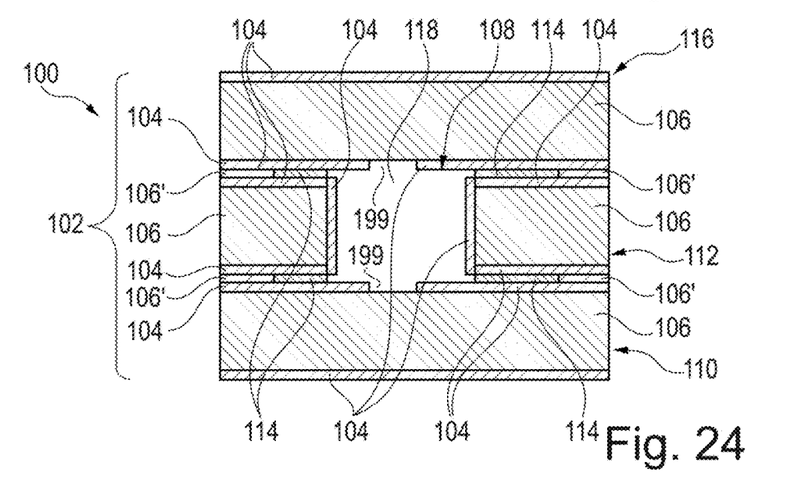

FIG. 21 to FIG. 24 illustrate cross-sectional views of structures obtained during carrying out a method of manufacturing a component carrier 100 according to an exemplary embodiment of the invention, shown in FIG. 24.

A difference between the embodiment of FIG. 21 to FIG. 24 compared to the embodiment of FIG. 12 to FIG. 16 is that, in the embodiment of FIG. 21 to FIG. 24, pre-cut sheets of uncured electrically insulating layer structures 106' (for instance prepreg) may be arranged side-by-side to sinter paste-type (or solder paste-type) electrically conductive connection medium 114 on the respective stack piece 112.

FIG. 25 illustrates a component carrier 100 according to still another exemplary embodiment of the invention.

A main difference between the embodiment of FIG. 25 and the embodiment of FIG. 2 is that, according to FIG. 25, the microwave structure 108 comprises a suspended stripline. The suspended strip line of FIG. 25 comprises an electrically conductive trace 144 in cavity 118 and on a high-frequency dielectric 146 (for instance a low DK and/or low DF resin). The high-frequency dielectric 146 extends along cavity 118 and is connected at its ends to material of stack 102.

Hence, the embodiment of FIG. 25 shows a suspended stripline substrate or PCB embedded suspended stripline, or an embedded suspended stripline substrate.

FIG. 26 illustrates a component carrier 100 according to yet another exemplary embodiment of the invention.

A main difference between the embodiment of FIG. 26 and the embodiment of FIG. 25 is that, according to FIG. 26, the microwave structure 108 comprises coaxial lines comprising an inner conductor 148 in cavity 118 surrounded by an outer conductor 150 which surrounds, in turn, cavity 118. The inner conductor 148 may be formed on a high-frequency dielectric 146 (compare FIG. 25). However, the latter mentioned dielectric can be FR4 as well, as it is completely surrounded by copper. Thus, the wave will not penetrate deep enough to be influenced by the carrier material of the center conductor. In an embodiment related to a suspended stripline, a high-frequency dielectric may be highly advantageous. Furthermore, the structures shown with reference signs 148, 146 may be based on a circular shape. The outer conductor 150 lines stack surfaces defining the cavity 118 and is composed of electrically conductive layer structures 104 and electrically conductive connection medium 114 of component carrier 100.

Thus, the embodiment of FIG. 26 shows a component board-embedded coaxial line.

Figure 27:
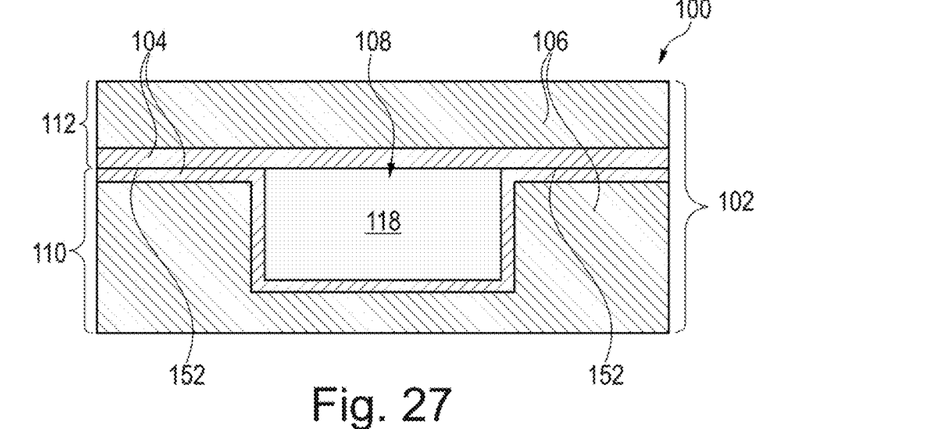
FIG. 27 illustrates a component carrier according to still another exemplary embodiment of the invention.

FIG. 27 illustrates a component carrier 100 according to still another exemplary embodiment of the invention.

A main difference between the embodiment of FIG. 27 and the embodiment of FIG. 3 is that, according to FIG. 27, electrically conductive layer structures 104 of the stack pieces 110, 112 are directly interconnected (see reference sign 152) with each other at the electrically conductive connection interface without an electrically conductive connection medium 114 in between. Thus, the electrically conductive layer structures 104 of the stack pieces 110, 112 are interconnected directly with each other, for instance by thermal bonding (such as thermocompression bonding).

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which variants use the solutions shown and the principle according to the invention even in the case of fundamentally different embodiments.

The invention claimed is:

1. A component carrier, comprising:
    a stack comprising at least one electrically conductive layer structure and at least one electrically insulating layer structure; and
    a microwave structure embedded at least partially in the stack, and configured for exciting a microwave propagation mode;
    wherein the stack with the microwave structure is composed of at least two stack pieces being interconnected with each other at an electrically conductive connection interface;
    wherein the at least two stack pieces are interconnected with each other by an electrically conductive connection medium and an electrically insulating layer structure;
    wherein the electrically conductive connection medium and the electrically insulating layer structure are arranged side-by-side.

2. The component carrier according to claim 1,
    wherein the at least two stack pieces are interconnected with each other by an electrically conductive connection medium which is different from the at least one electrically conductive layer structure;
    wherein the electrically conductive connection medium comprises at least one of the group consisting of a solder structure, a sinter structure, and an electrically conductive adhesive.

3. The component carrier according to claim 1, wherein electrically conductive layer structures of the at least two stack pieces are directly interconnected with each other at the electrically conductive connection interface without an electrically conductive connection medium in between.

4. The component carrier according to claim 1, comprising at least one of the following features:
    wherein the microwave structure comprises a waveguide;
    wherein the microwave structure comprises a suspended stripline;
    wherein the microwave structure comprises co-axial lines.

5. The component carrier according to claim 1, wherein the microwave structure comprises a cavity in an interior of the stack.

6. The component carrier according to claim 5, comprising at least one of the following features:
    wherein the cavity is completely surrounded by electrically conductive material with the only exception of at least one opening for feeding a signal;
    wherein the cavity is fully delimited by a waveguide fence of the microwave structure;
    wherein at least two sidewalls of the cavity are completely coated with electrically conductive material.

7. The component carrier according to claim 1, comprising at least one of the following features:
    wherein a solder-type electrically conductive connection medium has a thickness in a range from 0.25 µm to 10 µm;
    wherein a sinter-type electrically conductive connection medium has a thickness in a range from 5 µm to 70 µm.

8. The component carrier according to claim 1, wherein the microwave structure is composed of at least three stack pieces being interconnected with each other by at least two spaced sub-structures of the electrically conductive connection interface.

9. The component carrier according to claim 1, comprising at least one of the following features:

wherein the microwave structure is exteriorly delimited by circumferentially closed vertical side walls consisting exclusively of electrically conductive material;

wherein the microwave structure is exteriorly delimited by closed top and bottom walls consisting exclusively of electrically conductive material;

a microwave signal conduction path for conducting microwave signals from and/or to the microwave structure which extends substantially straight along at least one sidewall of at least one of the stack and a cavity of the microwave structure.

10. A method of manufacturing a component carrier, the method comprising:

providing a stack comprising at least one electrically conductive layer structure and at least one electrically insulating layer structure;

embedding a microwave structure configured for exciting a microwave propagation mode, at least partially in the stack; and interconnecting at least two stack pieces with each other at an electrically conductive connection interface, the at least two stack pieces forming the stack with the microwave structure;

wherein the at least two stack pieces are interconnected with each other by an electrically conductive connection medium and an electrically insulating layer structure;

wherein the electrically conductive connection medium and the electrically insulating layer structure are arranged side-by-side.

11. The method according to claim 10, wherein the method comprises interconnecting the at least two stack pieces with each other after applying an electrically conductive connection medium which is different from the at least one electrically conductive layer structure.

12. The method according to claim 11, comprising at least one of the following features:

forming the electrically conductive connection medium by at least one of the group consisting of soldering, diffusion soldering, sintering, and gluing;

applying a solder-type electrically conductive connection medium by at least one of the group consisting of a galvanic process, an immersion process, hot air solder leveling, and sputtering;

applying a solder-type electrically conductive connection medium as a multi-layer structure;

applying a sinter-type electrically conductive connection medium by at least one of the group consisting of printing, jetting, and dispensing, a sinter paste;

wherein the method comprises, after applying a sinter-type electrically conductive connection medium and before the interconnecting, increasing the viscosity of the sinter-type electrically conductive connection medium, by pre-drying the sinter paste;

directly interconnecting electrically conductive layer structures of the at least two stack pieces with each other at the electrically conductive connection interface by thermal bonding.

13. The method according to claim 10, comprising at least one of the following features:

wherein the method comprises interconnecting the at least two stack pieces additionally by curing an at least partially uncured electrically insulating layer structure between the at least two stack pieces;

wherein the method comprises forming the microwave structure by connecting an intermediate structure having a through hole between a continuous bottom structure and a continuous top structure;

wherein the method comprises forming the microwave structure by connecting a bottom structure having a blind hole with a continuous top structure, or by connecting a top structure having a blind hole with a continuous bottom structure.

14. A method, comprising:

providing a component carrier, the component carrier having a stack comprising at least one electrically conductive layer structure and at least one electrically insulating layer structure;

embedding a microwave structure embedded at least partially in the stack the microwave structure configured for exciting a microwave propagation mode;

wherein the stack with the microwave structure is composed of at least two stack pieces being interconnected with each other at an electrically conductive connection interface;

wherein the at least two stack pieces are interconnected with each other by an electrically conductive connection medium and an electrically insulating layer structure;

wherein the electrically conductive connection medium and the electrically insulating layer structure are arranged side-by-side; and exciting a microwave propagation mode for a high-frequency application.

15. The method according to claim 14, comprising at least one of the following features:

wherein the component carrier is used for wireless communication;

wherein the component carrier is used for high-frequency applications above 1 GHz.

* * * * *